United States Patent [19]

Coulson et al.

[11] Patent Number: 4,864,512
[45] Date of Patent: Sep. 5, 1989

[54] MEASUREMENT APPARATUS WITH PLURAL DISPLAYS OF MEASURED PARAMETER AND SELECTABLE FUNCTION THEREOF

[75] Inventors: Kenneth A. Coulson, Edmonds; Warren H. Wong; Tod K. Johnson, both of Seattle, all of Wash.

[73] Assignee: John Fluke Mfg. Co., Inc., Everett, Wash.

[21] Appl. No.: 898,251

[22] Filed: Aug. 20, 1986

[51] Int. Cl.$^4$ .............................................. G01R 1/00
[52] U.S. Cl. ................................... 364/481; 324/114; 340/716
[58] Field of Search ............... 364/579, 570, 487, 481, 364/417, 550, 497–499, 483; 324/77 R, 121 R, 76 R, 114; 128/709, 710; 340/716, 815.21, 815.23

[56] References Cited

U.S. PATENT DOCUMENTS

| | | | |
|---|---|---|---|
| 3,829,773 | 8/1974 | Nigg | 324/114 |
| 3,906,437 | 9/1975 | Brandwein et al. | 364/579 |
| 4,034,291 | 7/1977 | Allen et al. | 324/121 R |
| 4,041,386 | 8/1977 | Thomas et al. | 324/77 R |
| 4,065,664 | 12/1977 | Kristof et al. | 364/487 |
| 4,179,611 | 12/1979 | Mill et al. | 364/550 |
| 4,217,651 | 8/1980 | Pickering | 364/571 |
| 4,316,249 | 2/1982 | Gallant et al. | 364/487 |
| 4,322,807 | 3/1982 | Chamran et al. | 364/498 |
| 4,347,851 | 9/1982 | Jundanian | 128/668 |
| 4,399,502 | 8/1983 | MacDonald et al. | 364/579 |
| 4,402,055 | 8/1983 | Lloyd et al. | 364/579 |
| 4,454,577 | 6/1984 | Costantini et al. | 364/579 |
| 4,641,090 | 2/1987 | Danby | 324/107 |
| 4,789,824 | 12/9888 | Henkelmann | 324/114 |

OTHER PUBLICATIONS

Automatic Testing '80 Session I (Conference) Conference Proceedings, Paris, France (Sep. 23–25, 1980) "A Computer Controlled Test System for Characterization of Radiation Sensitive Electronic Components" by Gaebler et al., pp. 46–60.

"Digital Processing Oscilloscope", *Tektronix Inc.*, promotional publication circa 1973.

Barry Harvey, "Time-Shared DVM Displays Two Inputs Simultaneously", Jul. 1977, *Electronics*, vol. 50, No. 15, pp. 123, 125.

*Primary Examiner*—Parshotam S. Lall
*Assistant Examiner*—S. A. Melnick
*Attorney, Agent, or Firm*—George Thomas Noe; Stephen A. Becker; Israel Gopstein

[57] ABSTRACT

A measuring device includes a microprocessor controller programmed for performing any of a plurality of mathematical functions on a measured value of a parameter under test. The measuring device is provided with two displays, for displaying to a user both the parameter value and its mathematical function. Annunciators are provided to identify the displayed function of the parameter. Thus, together with the measured parameter value, offset, scaling, peak-to-peak values, or the uncertainty of a reading may be displayed, as well as statistical functions of the measurement, including an average, standard deviation, median or mode of the parameter under test. The mathematical function display is updated concurrently with the display of the measured parameter value.

28 Claims, 4 Drawing Sheets

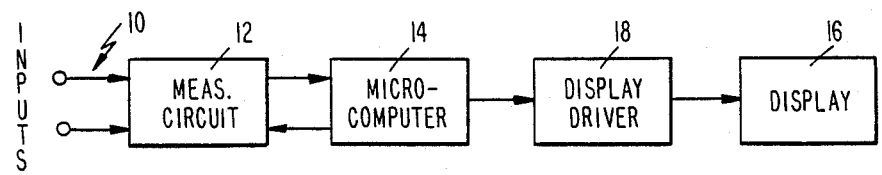
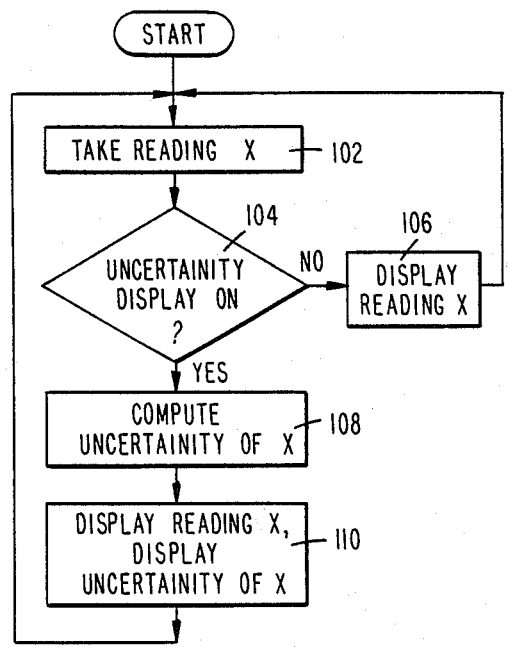
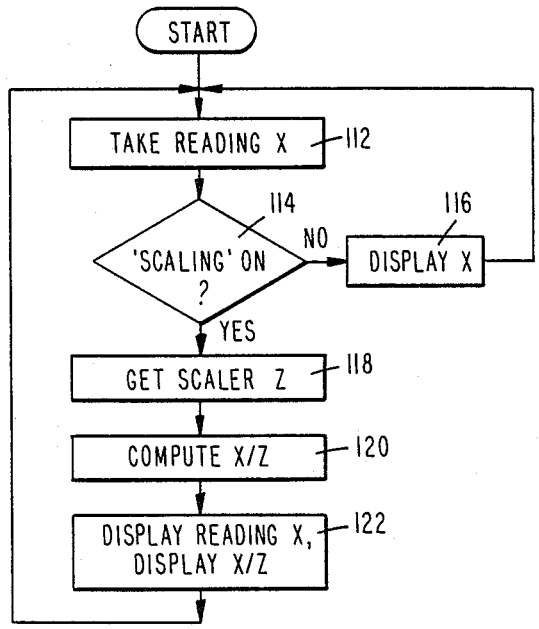

MEASUREMENT APPARATUS WITH PLURAL DISPLAYS OF MEASURED PARAMETER AND SELECTABLE FUNCTION THEREOF

TECHNICAL FIELD

This invention relates to digital multifunction metering devices, and more specifically to devices provided with a plurality of displays together with a calculating and control means for simultaneously displaying both a value of a measured parameter under test and a mathematical function of the currently measured parameter value.

BACKGROUND ART

In the measurement art it is known to use a single meter for performing any one of a number of different measurements. Such meters are known as multimeters, and encompass volt-ohm meters (VOM) and vacuum-tube voltmeters (VTVM) as illustrative examples. Multimeters which are digitally controlled, or have digital output displays, are known as digital multimeters (DMM). Prior art DMM's, under control of a programmed controller, are capable of controlling measurement of a particular characteristic of a parameter under test. The resultant measured value is displayed to a predetermined accuracy on a single display.

As is known in the art, readings obtained by measuring devices are subject to a determinable degree of uncertainty, which may be calculated as a function of the magnitude of the parameter being measured and the range, or full scale reading of the meter. A prior art device for calculating an uncertainty associated with a meter reading is known. Such a prior art metering device is capable of displaying only one of the two values of interest to a user. That is, either the measured value of the parameter or the measurement uncertainty is displayed.

However, it is often necessary for a user to know both the measured value and its uncertainty, or other mathematical functions thereof. For example, in a situation where a scaled or offset value of a measured parameter is displayed, the actual parameter value is also of interest. With prior art measuring devices, the user is constrained to determine an offset or scale value, and to rely on his or her own memory to reconvert the displayed scaled or offset value to determine the actual parameter value.

Thus, two sources of error are introduced by the prior art. Firstly, the user's memory may recall an incorrect scaling value for the reconversion. Secondly, the user's capacity for reconversion of the displayed value, by addition or subtraction and/or multiplication or division, may be flawed.

Thus, while prior art DMM's may include sensitive measurement circuitry as well as sophisticated calculation and control circuitry, the equipment is not utilized to its fullest extent. That is, although the programmable controller of a DMM is quite capable of performing various mathematical functions on the measured values, such functions are not performed because of the inability of the meter to display the functional results without at the same time overriding a display of the measured parameter value.

For example, in the above illustration it would be necessary to use two prior art devices for performing the necessary measurement and for providing displays indicative of both the measurement and its uncertainty.

A similar requirement is imposed if a user were to desire to utilize the controller to compute another mathematical function of the measured parameter. However, the use of plural devices is expensive.

In order to display simultaneously both the measured value and a mathematical function thereof, two conventional DMM's would be required in order to provide two displays. The DMM's must be arranged to communicate with one another and to permit a controller of one to control the display of the other. Thus, each DMM must be provided with interfacing capability for interfacing and communicating with the other. Moreover, if a conventional DMM were to be used with a separate, auxiliary display, proper interfacing and cabling must be provided, and the display would still require its own controller. Thus, the difficulties and expense associated with providing two displays tend to urge a user to rely on only a single DMM in order to reduce circuit complexity and expenses.

Clearly, measurements performed in such a manner may provide erroneous results, for reasons described above. Additionally, even where a user is possessed of a flawless memory and error free capacity for performing mathematical functions, the values of the measured parameter and its mathematical function are obtained only after substantial time delay. Thus, in those instances where it is necessary for a user to be provided with current easily manipulated information, an expensive arrangement is required in which plural devices are used.

Still another problem with the prior art approach relates to rapidly changing parameters. A user could not himself perform the mathematical functions quickly enough to keep up with the rate at which the meter generates results.

There is thus a need in the prior art for an inexpensive device which is capable of performing a measurement and a mathematical calculation on the measurement result, and which is further capable of providing substantially simultaneous and concurrent displays of the measured value and of a mathematical function.

DISCLOSURE OF INVENTION

It is accordingly an object of the present invention to overcome the difficulties of the prior art and to provide a single measurement apparatus for measurement of a parameter and for concurrently displaying both the measurement results and a function thereof.

It is a more specific object of the invention to provide an inexpensive measurement apparatus in which the measurement results and the results of a mathematical function performed thereon are concurrently displayed on a plurality of displays.

It is yet another object of the invention to provide a measurement apparatus in which a programmable microprocessor controller controls a measurement circuit to perform a measurement of an electrical parameter and in which the controller is further operated to perform a predetermined mathematical function on the measurement results, wherein both the measurement results and the mathematical function thereof are displayed simultaneously on a plurality of displays. Preferably, the mathematical function of the measured parameter is updated concurrently with the values of the parameter itself.

It is still a more specific object of the invention to provide a programmable metering device including a structural arrangement for displaying both a value of a measured quantity and the uncertainty associated with the measurement.

Yet another object of the invention is to provide a metering device including a programmable microprocessor for performing a statistical function on measured values of a parameter under test, and to display both the values being measured and the statistical function thereof.

Still a further object of the invention is the provision of a metering device including a memory for the measured values of a parameter under test, including an access control input for accessing stored values of the parameter by memory location singly or in a burst mode where plural values are accessed together, with display apparatus for displaying both the measured parameter and the accessed values thereof from the memory.

In accordance with the foregoing and other objects of the invention there is provided a measuring apparatus for performing any of a plurality of mathematical functions on a measured parameter under test and for simultaneously displaying both the measured value and the mathematical function thereof. A programmable control means performs any of the plural functions on the measured value, and a plurality of displays, specifically at least first and second displays, are provided for concurrent display of the data representing the measurement and the mathematical function thereof.

Preferably, the mathematical function is recalculated, and the display thereof updated, concurrently with updating of the values of the parameter being measured.

An annunciator may be provided to identify the function which is performed by the programmable control means and which is displayed on the displays. The annunciator may include further an error indicator, to display error messages associated with a specific function selected for performance by the control means and displayed on the display.

Preferably, the control means includes a programmable microprocessor which is programmed to receive a signal from a function selector arranged to select a mathematical function to be performed by the microprocessor. The specific function may be selected by a user through the use of the function selector to provide inputs to the programmed microprocessor which, in turn, performs the function and provides to the second display an output signal indicative of the mathematical function of the measured parameter for display thereon.

In accordance with one form of the invention, an uncertainty function selector is provided, for selecting for performance by the programmable controller an uncertainty computation for the parameter under test. The controller may be programmed to cause the measurement circuit to measure the parameter being tested, and to perform a sequence of operations resulting in an indication of the uncertainty of the measured value, as a function of the parameter amplitude and the measurement range, for example. The programmed controller directs the results of the measurement to the first display and the results of the uncertainty computation to the second display. Thus, both the measured signal parameter and the uncertainty thereof are displayed concurrently.

In accordance with another form of the invention, a statistical function selector is provided, for selecting for performance by the programmable controller a statistical computation for the parameter under test. The controller may be programmed to cause the measurement circuit to measure the parameter being tested, and to perform a sequence of operations resulting in an indication of the desired statistical characteristic of the measured value. The programmed controller directs the results of the measurement to the first display and the results of the statistical computation to the second display. Thus, both the measured signal parameter and the statistical characteristic thereof are displayed concurrently.

Preferably, the statistical function selector may select average, standard deviation, median or mode functions of the measured parameter for determination by the programmable controller.

Other functions which may be selected by the function selector and which may be performed by the programmable controller include scaling, offsetting, and storage of the measured parameter.

In accordance with a preferred embodiment of the invention, values of the measured parameter are stored in a memory of the measuring device. A memory access control is preferably provided to permit a user to access the stored measurement values. The inventive structure includes an arrangement for responding to the access selection by providing to the second display an indication of the accessed stored value, so that both the measured value and a past value thereof are displayed simultaneously.

Preferably, the access control includes an input identifier for specific storage location to be accessed and displayed. Further, the display includes an annunciator to identify the memory location at which the displayed contents are stored. In accordance with one aspect of the invention, the memory access control identifies burst mode access to memory, and the programmable control responds by sequentially accessing data stored in a plurality of locations of the memory. Thus, in this mode of operation, a sequence of previously measured data values obtained from the memory is displayed on the second display, together with display of the currently measured parameter on the first display.

BRIEF DESCRIPTION OF THE DRAWING

The foregoing and other objects, features and advantages of the invention will become more readily apparent to those of ordinary skill in the art to which the invention pertains upon reference to the following detailed description of the best mode for carrying out the invention, when considered in conjunction with the accompanying drawing in which a preferred embodiment of the invention is shown by way of illustration, wherein:

FIG. 1 illustrates in block diagram form a conventional measurement device

FIG. 4 provides a flow chart which illustrates operation of the invention to display the measured variable together with a scaled display of the reading;

FIG. 5 provides a flow chart which illustrates operation of the invention to display the measured variable together with an offset display of the reading;

DETAILED DESCRIPTION OF A PREFERRED EMBODIMENT

Figure 2:
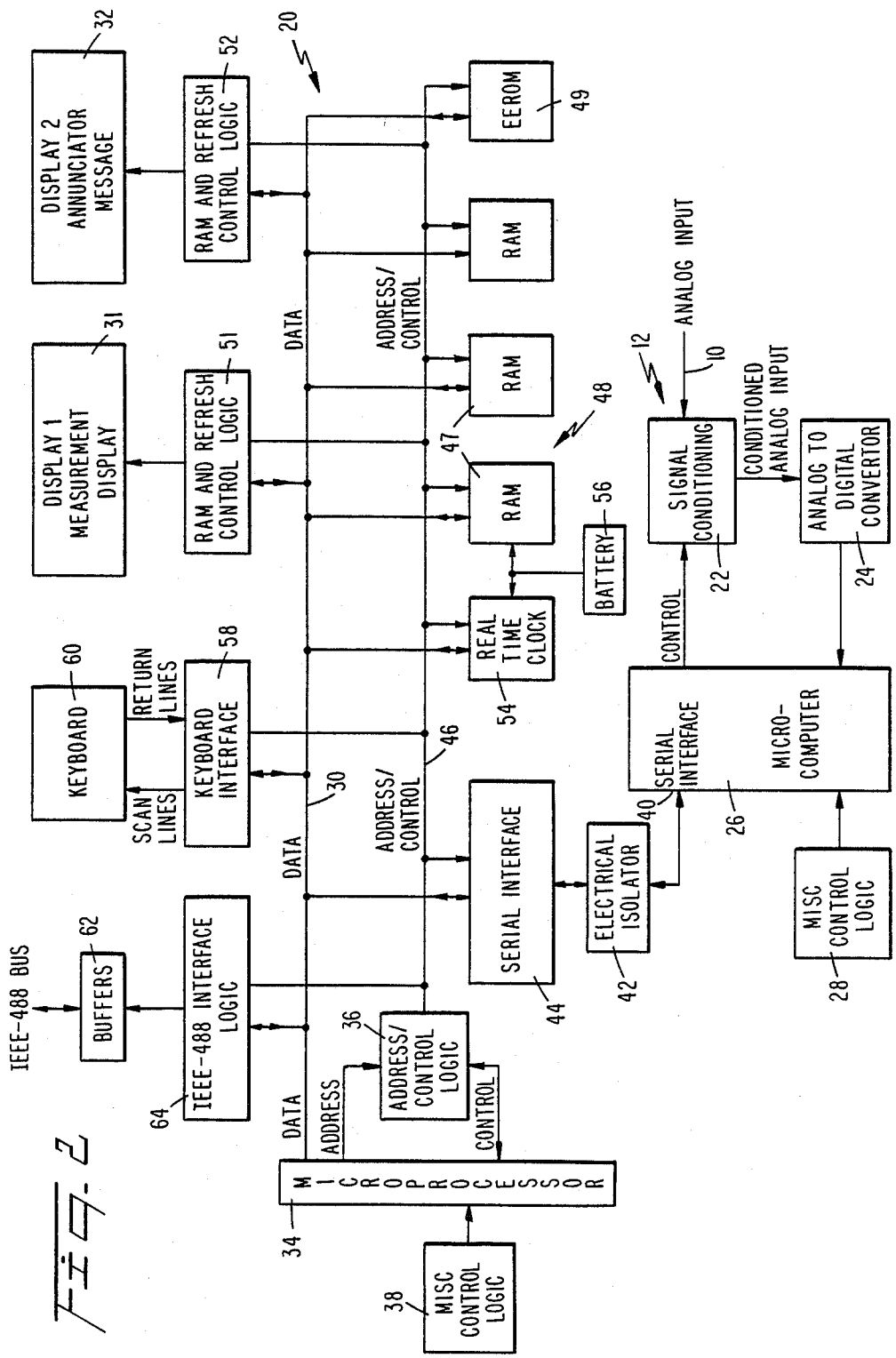
FIG. 2 provides a block diagram of a DMM in accordance with the present invention.

In order better to understand the advantages of the present invention, there is first broadly described a prior art measuring device and thereafter is provided a description of the present invention.

Referring now to the illustration of FIG. 1, there is shown a block diagram representation of a typical digital multimeter (DMM) of the prior art.

As is known to those of ordinary skill in the art, such meters operate by providing an input signal on a set of input leads 10 to a measuring circuit 12. The input signal may represent a voltage between two circuit points, a current through a particular circuit element, or the like.

The measuring circuit 12 determines a characteristic of the signal, such as amplitude, frequency or the like, generates a result, and converts the result to a digital form for processing by a microprocessor 14. Typically, measuring circuit 12 provides analogue-to-digital (AD) conversion of the input signal.

The appropriate determination of signal characteristic may be performed by measuring circuit 12 on the input signal parameters in response to a control signal provided by microprocessor 14 to the measuring circuit 12. Upon receipt of an appropriate command from a user, as by setting of a measurement function selecting switch, the microprocessor controls operation of the measuring circuit 12 to perform the appropriate measurement of the desired input signal characteristic.

It is also known that the microprocessor 14 may determine the uncertainty of the measured characteristic, or parameter value. Once the appropriate measurement has been made, or the appropriate determination performed by the microprocessor, the desired characteristic of the signal (e.g., amplitude, frequency, etc.) is provided by the measuring circuit 12 in digital form to microprocessor 14.

The microprocessor 14, which is programmed to convert the settings of the manual function switch to appropriate control signals for measuring circuit 12, is also programmed to transform the digital information output by the measuring circuit 12 to a format suitable for display on a display 16. The appropriately transformed signals are provided to a display driver 18 in order to properly drive display 16.

With the arrangement of FIG. 1, however, it is clear that only the measured parameter value or the calculated uncertainty may be displayed, and that it is impossible to display both the parameter and its uncertainty. Accordingly, the advantages of the presence of the microprocessor in the circuit are largely lost, as previously described.

Referring now to FIG. 2, there is shown a block diagram of a measuring apparatus 20 in accordance with the invention. As illustrated therein, an analogue input signal representing a value of a parameter under test is provided on input leads 10 to the measuring circuit 12, which is comprised of a signal conditioning logic 22 and an analogue-to-digital converter (ADC) 24. A microcomputer 26 controls the signal conditioning logic to provide appropriately conditioned signals to ADC 24 which appropriately determines the value of the input signal and converts the same to digital format for processing by a microprocessor 34, which receives the converted signal from the microcomputer 26 via the serial interface 40, 42, 44. The microprocessor 34 further directs the correct display.

The microprocessor 34 directs the microcomputer to provide appropriate control signals to conditioning logic 22. These control commands are transmitted to the microcomputer 26 via the serial interface 40, 42, 44. Although not shown in the diagram, microcomputer 26 includes read only memory (ROM) and random access memory (RAM) for storage of control programs and current signal and control parameter values.

The portion of the invention thus far described is not unlike the prior art DMM shown in FIG. 1. However, in the present invention the microprocessor outputs either the value of the parameter under test or a mathematical function thereof to a system data bus 30, and the data is displayed on the appropriate one of displays 31 and 32. Display 31 is dedicated to display of the value of the parameter under test, while display 32 is provided for display of mathematical functions of the value displayed on display 31.

Thus, the present invention provides simultaneous display of both the measured value and a mathematical function thereof.

It is noted that the output data and mathematical functions from microprocessor 34 are directed to the appropriate display under control of the microprocessor, which determines the appropriate display and outputs address and control signals to an address control logic 36. A miscellaneous logic circuit 38 is provided which, along with a similar miscellaneous logic circuit 28, includes low level logic functions for operation of the microprocessor or microcomputer. These circuits include, for example reset and clock generation logic.

Communication between the two programmable devices is illustratively shown as passing through a serial interface 40 of microcomputer 26, through an isolator 42, and a serial interface 44 to the system data bus 30 and to a system address/control bus 46. Thus, microcomputer 26 may provide data to the data bus 30 through serial interface 44, and microprocessor 34 performs the appropriate functions and outputs the information to displays. The identifying information may be communicated on data bus 30 to microprocessor 34 which, in accordance with control programs stored in the ROM, generates appropriate address and control signals for address control logic 36, thereby activating the designated display 31 or 32 to accept the data.

Alternatively, as will be recognized by those of ordinary skill in the art, microprocessor 34 may be programmed to generate control signals on bus 46, the control signals communicated to microcomputer 26 through serial interfaces 44 and 40. The control signals request from microcomputer 26 the data signals which, when provided, are directed to the appropriate display.

Both data and control signals are stored in a memory system 48, including RAM's 47 and ROM's, and particularly including an electrically-erasable ROM 49 for non-volatile storage. Displays 31 and 32 are respectively provided with a RAM and refresh control logic units 51 and 52. A real-time clock 54 is powered by a battery 56, as is one of RAM units 47 for storing time and date data during system shut-down conditions.

Also provided in the system is a keyboard interface 58 for a keyboard 60, and further memory buffers 62 connected through interface logic 64 to the system data bus 30. Through buffers 62 and a separate bus connected thereto, the present system may be connected to other systems for transmittal to, or receipt from, such systems of measured data, mathematical functions, control signals and the like.

Keyboard 60 includes a number of keys for input of user selections of measurement functions to be performed, data ranges, mathematical function to be performed on the measured data and memory operations, for example. Thus, keys may be provided to cause microcomputer 26 to obtain any of the following characteristics of the parameter under test: VDC, VAC, VAC+VDC, OHMS 2-W, OHMS 4-W, IDC and IAC, for example. Additionally, keyboard 60 preferably includes range setting keys for the measurement data, including an autoranging key. Other keys which may be provided on the keyboard include power ON/OFF and CALIBRATION keys.

Of course, the term "keyboard" is used herein in a generic sense as a means for inputting user selections to the system, since the various above described functions may be provided to the microprocessor 34 and microcomputer 26 by various toggle switches, slide switches, circular switches, mechanical switches, electronically controlled switches, or programmable (or soft) switches including adjacent vacuum fluorescent displays. Further, the keyboard may include a numeric keypad for entry of specific data to the system.

Still another function of the keyboard 60 is to enter the mathematical function to be performed by microprocessor 34 on the measured data. Thus, keyboard 60 includes switches for selecting computation of the uncertainty associated with a displayed measured value. Other keys may be provided for selecting statistical functions to be performed on a sequence of readings of the measured parameter, including providing an average, a standard deviation, a median, a mode or other statistical characteristic of the parameter under test. Still other keys may be provided for manipulation of display 32 to display previously measured values of the parameter which may be stored in a RAM, for example.

In that regard, a "memory" key may be provided, together with a further key to control access of the stored data. The additional key preferably identifies the access as being in burst mode, wherein a sequence of readings is obtained from memory and displayed, or in a single reading mode, wherein a previously measured value may be accessed from a known memory location.

The measuring apparatus of the present invention is provided with a capacity for performing scaling and offsetting functions, as well as a peak (peak-to-peak) display function. However, other functions may be programmed into the system, including a rate function, a filter function, trigonometric functions, local-remote and test functions, and the like. It will be recognized that any function capable of performance by a microcomputer may be performed by microprocessor 34 on the input measurement data.

A significant aspect of the present invention is the simultaneous display of both the measured parameter and the mathematical function thereof. In that regard, two displays are provided, although it should be recognized that additional displays may be used in a single measuring device, thus permitting display of a measured value and several mathematical functions thereof.

Still another advantage of the invention results from continuing update of the mathematical function, so that the displayed function accurately reflects the most up-to-date function of the measured value. It is known that for a digital metering apparatus as shown in FIG. 2, wherein analogue-to-digital conversion is utilized, the parameter is repeatedly read by the system. In accordance with the invention, each time the parameter is read the mathematical function is again performed, using the newly read parameter value. Thus, as will be appreciated from the following description of operation of the invention, for each reading of the parameter being measured the displayed function is updated.

Yet another feature of the invention resides in the provisions of various annunciators in the displays. Preferably, one or both of displays 31, 32 includes a function annunciator, to display together with the computed mathematical function data an identification of the specific function being performed. An additional annunciator provides error messages to a user, while still another displays the memory location from which a value was accessed for display.

An illustration of an error message included in the display is an "out of range" or "overrange" error for a calculated function of a measured variable. In accordance with the present invention, autoranging is used to range to the correct range of the input parameter, and only then is the mathematical function performed. If after autoranging the function result is too large for the display, for example, the "overrange" error message is displayed.

Yet another annunciator provided on display 32 may identify a dimensional unit for displays of uncertainty of a reading. Significantly, it is known that for a measurement of "X" the level of uncertainty is expressed as a function of the reading X and of the full scale, or range, of the meter. Thus, a level of uncertainty is typically expressed as (A*X+B), where A is a unitless number expressed in parts per million or as a simple percentage, and B is a quantity having the same units as X. Thus, for any given value X there is a corresponding level of uncertainty. The present invention provides simultaneous displays of the reading X, the uncertainty level, and the units in which the uncertainty is expressed, specifically as parts-per-million, as a percentage of the reading, or as a count.

The uncertainty level is updated concurrently with the measured variable, so that a user is constantly aware of that level and does not need to recalculate the same mentally.

Figure 3:
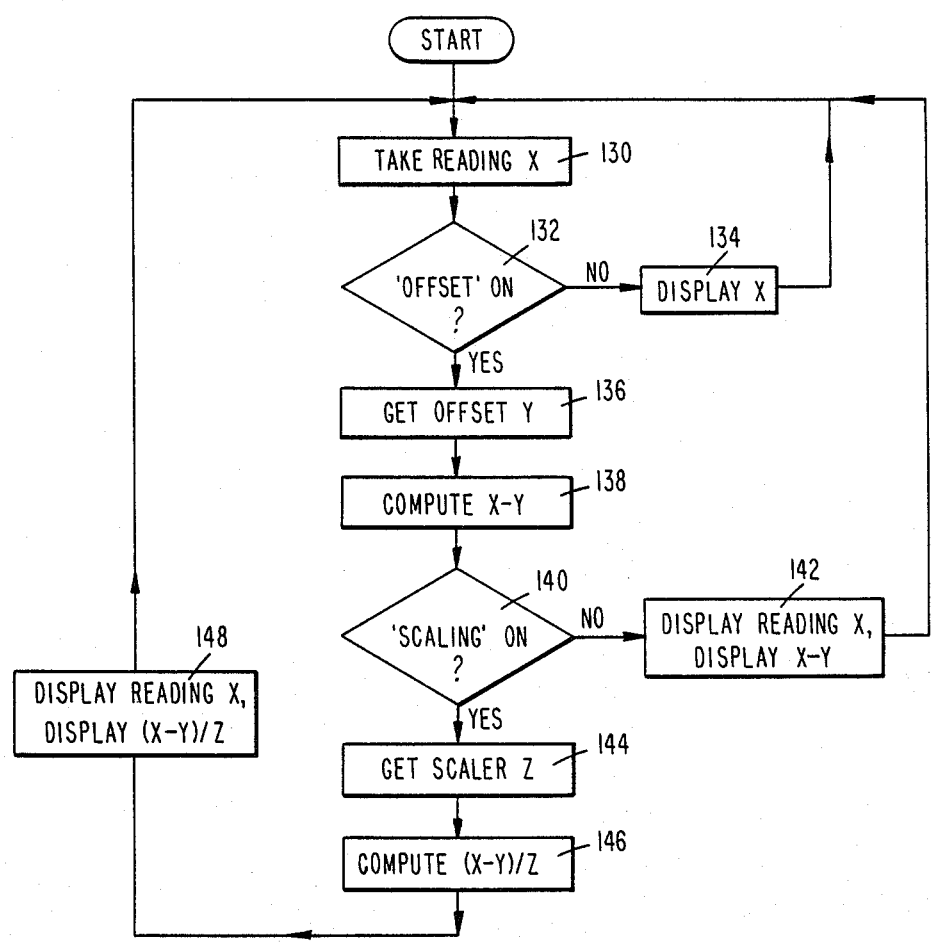
FIG. 3 provides a flow chart which illustrates operation of the invention to display the measured variable together with an uncertainty in the reading.

Thus, referring to the flow chart of FIG. 3, the method for providing concurrently updated displays of both the parameter and its uncertainty level is described. At step 102 the parameter X is read. At step 104 it is determined whether the uncertainty function is to be computed. If the uncertainty selector has not been set, the reading X is displayed at step 106 and control returns to step 102. If the uncertainty selector has been set, however, the result of the inquiry at step 104 is affirmative, and control passes to step 108 where the uncertainty of the reading is computed, as previously described. At step 110 both the reading and the uncertainty are displayed, and control again passes to step 102.

Thus, not only is uncertainty displayed together with the measured variable, but the uncertainty is recomputed each time a new reading is taken of the variable, so that only the actual and up-to-date value of the uncertainty function is displayed.

Referring now to FIG. 4, there is illustrated operation of the invention for simultaneous display of both the measured parameter x and its value scaled by a divisor z, which may be any non-zero value chosen by the user. The scaling operation may be performed on an offset value of the variable, which will be appreciated from description of the flow chart of FIG. 5.

At FIG. 4, however, the measured parameter is read at a step 112 and the setting of a scaling select button on keyboard is determined at step 114. If the scaling function has not been selected, the measured parameter is displayed at step 116 and control returns to step 112. If the scaling function has been selected, operation proceeds from step 114 to step 118 where the scaler value z, input by the user, is obtained and used as a divisor for the parameter value at step 120. The resultant quotient, along with the measured parameter value, are displayed at step 122. Thus, both the measured value of the parameter and its scaled version are displayed simultaneously, on displays 31 and 32, respectively.

At FIG. 5 is provided a flow chart illustrating system operation for displaying an offset of the measured parameter as well as for displaying a scaled value of an offset of the measured parameter. Thus, at step 130 the value of the parameter is obtained. At step 132 it is determined whether or not the offset function has been selected. If offset display has not been selected control transfers to step 134, wherein the measured value of the parameter is displayed and the next value of the parameter is read at step 130.

At step 132 if it is determined that the offset selection has been made, control proceeds to step 136 where an offset value y, which may be input by a user or may be a previously obtained reading of the measured parameter, is obtained. At step 138 the difference x-y is computed to provide an offset value of the measured parameter. At step 140 it is determined whether, in addition to the selection of offset display, the scaling display has been selected. In the event that scaling has not been selected, control transfers to step 142 for display of the measured parameter on display 31 and display of the offset value on display 32. In the event that at step 140 it is determined that the scaling function has been selected for display, the flow chart of FIG. 4 is incorporated as steps 144, 146 and 148. Specifically, the scaler z is obtained at step 144 and the quotient obtained at step 146. The measured parameter as well as the scaled and offset value thereof are displayed in accordance with step 148.

Figure 6:
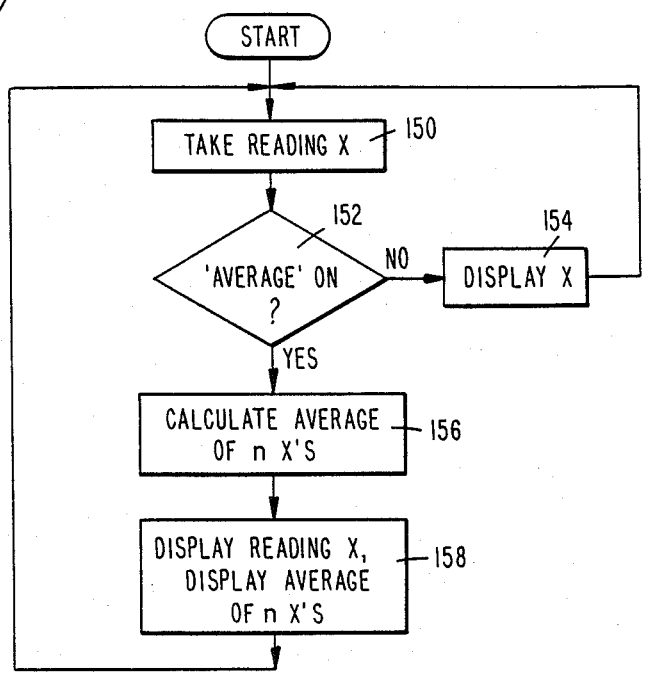
FIG. 6 provides a flow chart which illustrates operation of the invention to display the measured variable together with an average value of the reading.

FIG. 6 illustrates a sequence of operations wherein the measured parameter and a statistical function thereof are simultaneously displayed and updated. Therein, the value of the measured parameter is obtained at step 150 and at step 152 it is determined whether the statistical function, specifically the averaging function, has been selected for display. If the function has not been selected control transfers to step 154 wherein the parameter itself is displayed. Where the averaging function has been selected for display, control transfers from step 152 to step 156 where an average value is calculated for a number "n" of values of the parameter. At step 158 the display of both the parameter value x and the average value thereof over n readings is effected, prior to returning control to step 150.

Although the flow chart of FIG. 6 illustrates the display of an average of the measured parameter, it is quite clear that the microprocessor 34 may be instructed to perform any of a number of other statistical functions, such as obtaining a mode, a median, a standard deviation, or other statistical characteristic of the parameter at step 156, upon appropriately determining at step 152 that the specific function was selected for display.

Although the flow charts in FIGS. 3–6 are provided to illustrate operation of the inventive device for display of a measured parameter and a single, current mathematical function, it should be appreciated that a flow chart for controlling operation of the inventive device incorporates each of the charts of FIGS. 3–6. Thus, in general, the parameter value is read and it is determined which of the functions have been selected for display. If none of the mathematical functions are selected, the measured parameter is displayed and a next reading of the same is taken. Upon determination that a particular one of the available functions is selected, the microprocessor 34 is caused to compute the mathematical function and the parameter as well as its function are displayed, prior to obtaining a next reading of the parameter value.

In the present invention both the structure and operation of conventional measuring devices are improved to provide automatic handling and display by a single instrument of both a measurement and a mathematical function thereof, such as uncertainty, statistical parameters, etc., thus obviating prior art need for multiple instruments. More specifically, as previously described herein, a single DMM is u ed both to obtain a current measurement value and to obtain a current mathematical function thereof, and at least two displays are provided to display simultaneously both the measurement and the mathematical function. Thus, the present invention provides a DMM which performs functions previously requiring the use of two or more DMM's.

Still other functions may be performed, however. For example, a plurality of input leads 10 may provide a plurality of measured parameters to the microcomputer 26 and microprocessor 34. The plural input leads would be connected through multiplexing switches to signal conditioning logic, in order to provide the various parameters in appropriately multiplexed fashion. Microprocessor 34, in response to selection of an appropriate function by keyboard 60, may perform a mathematical function on several of the parameter values. One example is the input of two parameter values and the determination of a ratio thereof. The ratio would be displayed on one of the displays and the individual parameter values would be displayed on the other display.

Figure 7:
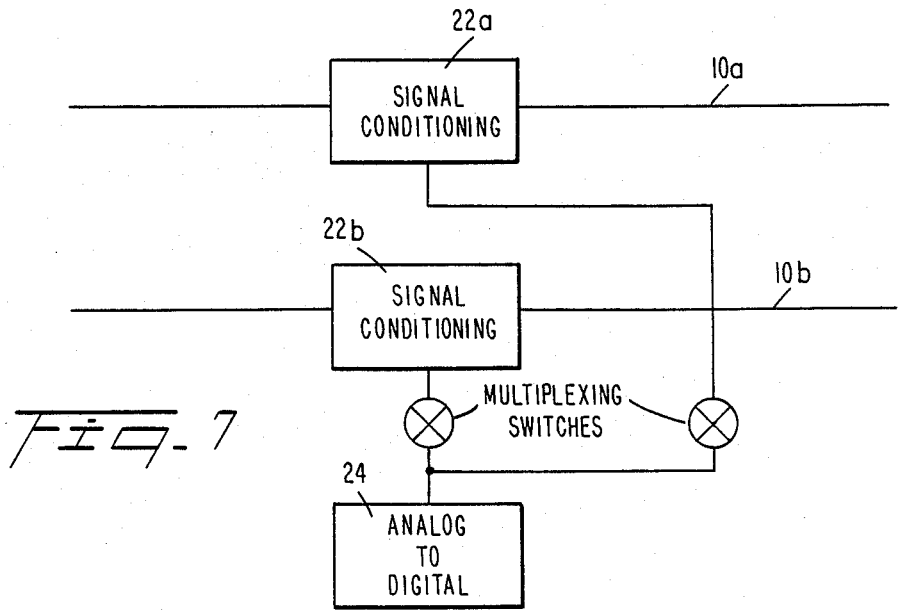
FIG. 7 shows a variation of the DMM of FIG. 2.

Alternatively, the ratio function may be implemented by modifying the DMM as shown in FIG. 7. As seen therein, the input leads 10 and signal conditioning logic 22 are replicated, and multiplexing switches are provided to input the appropriately conditioned signals from logic units 22a, 22b to ADC 24 in an appropriately multiplexed fashion.

There has thus been shown a method and apparatus for simultaneously displaying a measured parameter or parameters and a current and updated mathematical function thereof. In accordance with the invention, these advantages are achieved by the disclosed structure, wherein two displays are provided and wherein a microcomputer and a controller are programmed to obtain a value of the parameter or parameters being measured and to perform a selected mathematical function on the current (or previously obtained) value or values as well as to display simultaneously both the parameter and its function.

The preceding specification describes a preferred embodiment of the invention as an illustration and not a limitation thereof. It is appreciated that equivalent variations will occur to those skilled in the art. Such modifications, variations and equivalents are within the scope of the invention as recited with greater particularity in the appended claims when interpreted to obtain the benefits of all equivalents to which the invention is legally and equitably entitled.

What is claimed is:

1. A measuring apparatus for controllably performing any of a plurality of mathematical functions on a value of a measured parameter under test and for simultaneously displaying the value of the measured parameter and the mathematical function thereof, comprising:

measuring means for measuring said parameter under test and for obtaining a value therefor;

programmable control means for controllably performing any of said plurality of mathematical functions on the value of said measured parameter; and plural display means including at least first and second displays for concurrently displaying the value of said measured parameter and the mathematical function thereof performed by said programmable control means further comprising function selecting means for selecting any one of said plurality of mathematical functions to be performed by said programmed control means.

2. A measuring apparatus as recited in claim 1 further comprising update means for updating said displayed mathematical function of said measured parameter.

3. A measuring apparatus as recited in claim 2 wherein said measuring means is operable for repeatedly reading values of said measured parameter for measurement and display, and wherein said update means includes means for updating said displayed mathematical function of said measured parameter with each reading of said measured parameter, thereby providing for display updated values of said mathematical function of the measured parameter, said updated function values being current with the displayed value of said measured parameter.

4. A measuring apparatus as recited in claim 1 further comprising annunciating means for annunciating the mathematical function of said parameter under test performed by said programmable control means and displayed on at least one of said display means.

5. A measuring apparatus as recited in claim 1 further comprising uncertainty function selecting means for selecting a function identifying uncertainty in the parameter being measured to be performed by said programmable control means, wherein said programmable control means comprises means for receiving an input from said uncertainty function selecting means, uncertainty parameter determining means responsive to the input and operable for determining the uncertainty in the parameter being measured, and means for providing to said second display an output signal indicative of the uncertainty of the value of the measured parameter displayed on said first display, whereby said plural display means concurrently display measurement results and the uncertainty of said measurement results.

6. A measuring apparatus as recited in claim 1 wherein said function selecting means comprises peak function selecting means for selecting a peak function to be performed by said programmable control means for identifying a peak value of the parameter being measured, wherein said programmable control means comprises means for receiving an input from said peak function selecting means, peak value determining means for responding to the input by determining the peak value of the parameter being measured, and means for providing to said second display an output signal indicative of the peak value of the measured parameter displayed on said first display, whereby said plural display means concurrently display measurement results and a peak value of said measurement results.

7. A measuring apparatus as recited in claim 1 wherein said function selecting means comprises scaling selecting means for selecting a scaling function to be performed by said programmable control means for identifying a scaled value of the parameter being measured, wherein said programmable control means comprises means for receiving an input from said scaling function selecting means, difference determining means responsive to the input and operable for determining a difference between the measured value of the parameter and a second value, means for dividing the difference by a third value selected by the user to provide a quotient representing a scaled form of the parameter being measured, and means for providing to said second display an output signal indicative of the scaled form of the measured parameter displayed on said first display, whereby said plural display means concurrently display measurement results and a scaled representation of said measurement results.

8. A measuring apparatus as recited in claim 1 wherein said function selecting means comprises offset function selecting means for selecting an offset function to be performed by said programmable control means for identifying an offset value of the parameter being measured, wherein said programmable control means comprises means for receiving an input from said offset function selecting means, difference determining means responsive to the input and operable for determining a difference between the measured value of the parameter and a second value, to provide a difference representing an offset form of the parameter being measured, and means for providing to said second display an output signal indicative of the offset form of the measured parameter displayed on said first display, whereby said plural display means concurrently display measurement results and an offset representation of said measurement results.

9. A measuring apparatus as recited in claim 1 further comprising an input for a second parameter under test to permit display of values of both parameters and a mathematical function of values of said parameters, said measuring means being operable for measuring said second parameter and for obtaining a value thereof, said program control means operable for performing said mathematical function on the values of both of said measured parameters, and said plural display means operable for displaying both the values of said measured parameters and the mathematical function thereof.

10. A measuring apparatus as recited in claim 9 wherein said function selecting means comprises a ratio function selecting means for selecting a ratio function to be performed by said programmable control means for identifying a ratio of the parameters being measured, wherein said programmable control means comprises means for receiving an input from said ratio function selecting means, ratio determining means responsive to the input and operable for determining the ratio of the parameters being measured, and means for providing to said second display an output signal indicative of the ratio of the measured parameters displayed on said first display, whereby said plural display means concurrently display measurement results and a ratio of said measurement result.

11. A measuring apparatus as recited in claim 1 wherein said parameter under test is an electrical parameter and further including a sensor means for sensing said electrical parameter,
wherein at least one of said first and second displays of said plural display means displays the value of the electrical parameter sensed by said sensor means.

12. A measuring apparatus for controllably performing any of a plurality of mathematical functions on a measured value of a parameter under test and for simultaneously displaying the measured value and the mathematical function thereof, comprising:
measuring means for measuring said parameter under test and for obtaining a value therefor;
programmable control means for controllably performing any of said plurality of mathematical functions on said measured parameter value;
plural display means including at least first and second displays for concurrently displaying said measured parameter value and a mathematical function thereof; and
annunciating means for annunciating the mathematical function of said parameter under test performed by said programmable control means and displayed on at least one of said display means;
wherein said annunciating means includes error indicating means for displaying error message associated with a mathematical function selected for performance by said programmable control means and for display on at least one of said display means.

13. A measuring apparatus for controllably performing any of a plurality of mathematical functioning on a measured value of a parameter under test and for simultaneously displaying the measured value and the mathematical function thereof, comprising:
measuring means for measuring said parameter under test and for obtaining a value therefor;
programmable control means for controllably performing any of said plurality of mathematical functions on said measured parameter values;
plural display means including at least first and second displays for concurrently displaying said measured parameter value and a mathematical function thereof; and
further comprising function selecting means for selecting a mathematical function to be performed,
wherein said programmable control means comprises a programmable microcomputer means, said microcomputer means programmed for receiving an input from said function selecting means and for responding to the input by performing the selected mathematical function and by providing to said second display an output signal indicative of the mathematical function of the measured parameter, whereby said plural display means concurrently display measurement results and mathematical functions of said measurement results.

14. A measuring apparatus for controllably performing any of a plurality of mathematical functions on a value of a measured parameter under test and for simultaneously displaying the value of the measured parameter and the mathematical function thereof, comprising:
measuring means for measuring said parameter under test and for obtaining a value therefor;
programmable control means for controllably performing any of said plurality of mathematical functions on the value of said measured parameter; and
plural display means including at least first and second displays for concurrently displaying the value of said measured parameter and the mathematical function thereof performed by said programmable control means,
further comprising statistical function selecting means for selecting from said plurality of mathematical functions a statistical function to be performed by said programmable control means for identifying a statistical characteristic of the parameter being measured,
wherein said programmable control means comprises means for receiving an input from said statistical function selecting means, statistical parameter determining means responsive to the input and operable for determining the selected statistical characteristic of the parameter being measured, and means for providing to said second display an output signal indicative of the statistical characteristic of the measured parameter displayed on said first display, whereby said plural display means concurrently display measurement results and a statistical characteristic of said measurement results.

15. A measuring apparatus as recited in claim 14, wherein said statistical function selecting means includes average selecting means for selecting an averaging function to be performed by said programmable control means and said statistical parameter determining means includes averaging means for determining an average value for measured values of the measured parameter.

16. A measuring apparatus as recited in claim 14, wherein said statistical function selecting means includes standard deviation selecting means for selecting a standard deviation function to be performed by said programmable control means and said statistical parameter determining means includes deviation means for determining a standard deviation for measured values of the measured parameter.

17. A measuring apparatus as recited in claim 14, wherein said statistical function selecting means includes median selecting means for selecting a median function to be determined by said programmable control means and said statistical parameter determining means includes median means for determining a median value for measured values of the measured parameter.

18. A measuring apparatus as recited in claim 14, wherein said statistical function selecting means includes mode selecting means for selecting a mode function to be determined by said programmable control means and said statistical parameter determining means includes mode means for determining a mode value for measured values of the measured parameter.

19. A measuring apparatus as recited in claim 14 wherein said statistical function selecting means is operable for selecting said structural function to be performed by said programmable control means from among a plurality of statistical functions.

20. A measuring apparatus for controllably performing any of a plurality of mathematical functions on a value of a measured parameter under test and for simultaneously displaying the value of the measured parameter and the mathematical function thereof, comprising:
   measuring means for measuring said parameter under test and for obtaining a value therefor;
   programmable control means for controllably performing any of said plurality of mathematical functions on the value of said measured parameter; and
   plural display means including at least first and second displays for concurrently displaying the value of said measured parameter and the mathematical function thereof performed by said programmable control means,
   further comprising memory means for storage of measurement values of the parameter being measured and access means for accessing measurement values stored in said memory means,
   wherein said programmable control means comprises means for receiving an input from said access means, retrieval means responsive to the input and operable for accessing said memory means, and means for providing to said second display an output signal indicative of an accessed stored value of said parameter being measured, whereby said plural display means concurrently display a present measurement result and a representation of previously measured values of said parameter under test.

21. A measuring apparatus as recited in claim 20, wherein said access means comprises means for identifying a storage location in said memory means to be accessed by said retrieval means, and wherein said retrieval means includes means for accessing the memory location identified by said means for identifying.

22. A measuring apparatus as recited in claim 21, wherein said second display comprises annunciating means for identifying said memory location accessed by said programmable control means.

23. A measuring apparatus as recited in claim 20 wherein said access means comprises burst means for accessing said memory means in a burst mode, and said programmable control means includes means responsive to said burst means by sequentially accessing data stored in a plurality of locations of said memory means, said means for providing further including means responsive to said burst means for providing to said second display a sequence of output signals indicative of said sequentially accessed data from said plurality of locations of said memory means, whereby said plural display means concurrently displays a present measurement result and a representation of a sequence of previously measured values of said parameter under test.

24. The system of claim 23 wherein said programmable control means is operable for performing said mathematical function on each of said sequentially accessed data from said plurality of locations of said memory means thereby to display a sequence of values of the measured parameter and a corresponding sequence o values respectively obtained by performing the selected mathematical function thereon.

25. In a measuring system having an input for a measured parameter, a measuring circuit for providing a digital signal representative of the measured parameter, a microcomputer for converting the digital signal representative of the measured parameter to a display signal, a user controlled switching means for controlling the measuring circuit to output a signal representative of a desired particular parameter and a display means for displaying a value of the desired particular parameter as measured by the measuring circuit, the improvement comprising:
   selecting means in said user controlled switching means for selecting a desired mathematical function to be performed on the measured parameter,
   processing means responsive to said selecting means of said user controlled switching means for performing a selected mathematical function on the value of the measured parameter in accordance with a setting of said selecting means,
   said processing means outputting second display signals representative of a result of performing said selected mathematical function on the value of the measured parameter, and
   second display means for displaying a value represented by said second display signals, thereby displaying said mathematical function of said value of the measured parameter on said second display means while said value of the measured parameter is displayed on said first mentioned display means.

26. The system claim 25 wherein said measuring circuit, said microcomputer, said switching means, said display means, said selecting means, said processing means and said second display means are arranged to form a single digital multimeter for measuring electrical parameters.

27. The system of claim 26 wherein said processing means comprises means for computing an uncertainty of said measured parameter.

28. The system of claim 27 wherein said means for computing an uncertainty comprises means operably for computing an equation $A*X+B$, wherein X is the value of the measured parameter expressed in a particular dimensional unit, A is a coefficient representing a percentage of uncertainty of X, and B is a quantity having a dimensional unit corresponding to the dimensional unit of the measured parameter.

* * * * *